US006400295B1

(12) United States Patent
Van Herzeele

(10) Patent No.: US 6,400,295 B1
(45) Date of Patent: Jun. 4, 2002

(54) TRANSDUCER INTERFACE ARRANGEMENT INCLUDING A SIGMA-DELTA MODULATOR WITH OFFSET CORRECTION AND WITH GAIN SETTING

(75) Inventor: Geert Eric Lina Van Herzeele, Kampenhout (BE)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/708,711

(22) Filed: Nov. 9, 2000

(30) Foreign Application Priority Data

Nov. 19, 1999 (EP) .............................. 99402897

(51) Int. Cl.[7] .............................................. H03M 1/66
(52) U.S. Cl. ....................................... 341/143; 341/172
(58) Field of Search .................................. 341/143, 172, 341/154

(56) References Cited

U.S. PATENT DOCUMENTS

| 4,999,634 | A | * | 3/1991 | Brazdrum et al. ........... 341/143 |
| 5,001,725 | A | * | 3/1991 | Senderowicz et al. ....... 341/143 |
| 5,057,839 | A | * | 10/1991 | Koch .......................... 341/143 |
| 5,134,401 | A | * | 7/1992 | McCartney et al. ......... 341/143 |
| 5,140,325 | A | | 8/1992 | Yu et al. ..................... 341/143 |
| 5,363,102 | A | * | 11/1994 | Ferguson, Jr. ............... 341/143 |
| 5,572,107 | A | * | 11/1996 | Koch et al. .................. 341/143 |
| 5,659,314 | A | | 8/1997 | Tokura et al. ............... 341/143 |
| 5,691,720 | A | * | 11/1997 | Wang et al. ................. 341/143 |
| 5,703,589 | A | * | 12/1997 | Kalthoff et al. ............. 341/143 |
| 5,724,038 | A | * | 3/1998 | Koifman et al. ............. 341/143 |
| 5,793,811 | A | * | 8/1998 | Yu .............................. 341/143 |
| 5,838,270 | A | * | 11/1998 | Kiriaki ........................ 341/143 |
| 5,917,440 | A | * | 6/1999 | Khoury ....................... 343/143 |
| 5,949,360 | A | * | 9/1999 | Maejima ..................... 341/143 |

* cited by examiner

Primary Examiner—Peguy JeanPierre
Assistant Examiner—Jean Bruner JeanGlaude
(74) Attorney, Agent, or Firm—Sughrue Mion, PLLC

(57) ABSTRACT

A transducer interface arrangement including sensor means (SM) for measuring a parameter such as temperature, pressure, . . . , an Analog-to-Digital Converter (ADCb) including a Sigma-Delta Modulator (SDMb), and a selectable resistor string (SRSa). The data input of the Sigma-Delta Modulator is connected to the series combination of a first switched-capacitor module (SC1, SC1b), a first differential amplifier (A1), a second switched capacitor module (SC2) and a second differential amplifier (A2), followed by a comparator (CP). The modulator further comprises a third (SC3) and a fourth (SC4) switched-capacitor module to which a reference voltage is applied and which are respectively connected to the input of the first and the second amplifier. To reduce the chip area and power consumption while increasing the performance of the arrangement, an offset-canceling pre-amplifier to the A/D converter is advantageously replaced by a fifth switched-capacitor module (SC5), to which an offset voltage is applied. The offset voltage is provided, together with the reference voltage, by the selectable resistor string (SRSa). In addition to the improved offset correction, the present transducer interface arrangement is also provided with simple gain setting means. To this end, gain setting modules consisting of one or more switchable capacitive branches coupled in parallel with existing capacitors in the first switched-capacitor module (SC1b). The more branches which are added, the higher the gain.

12 Claims, 5 Drawing Sheets

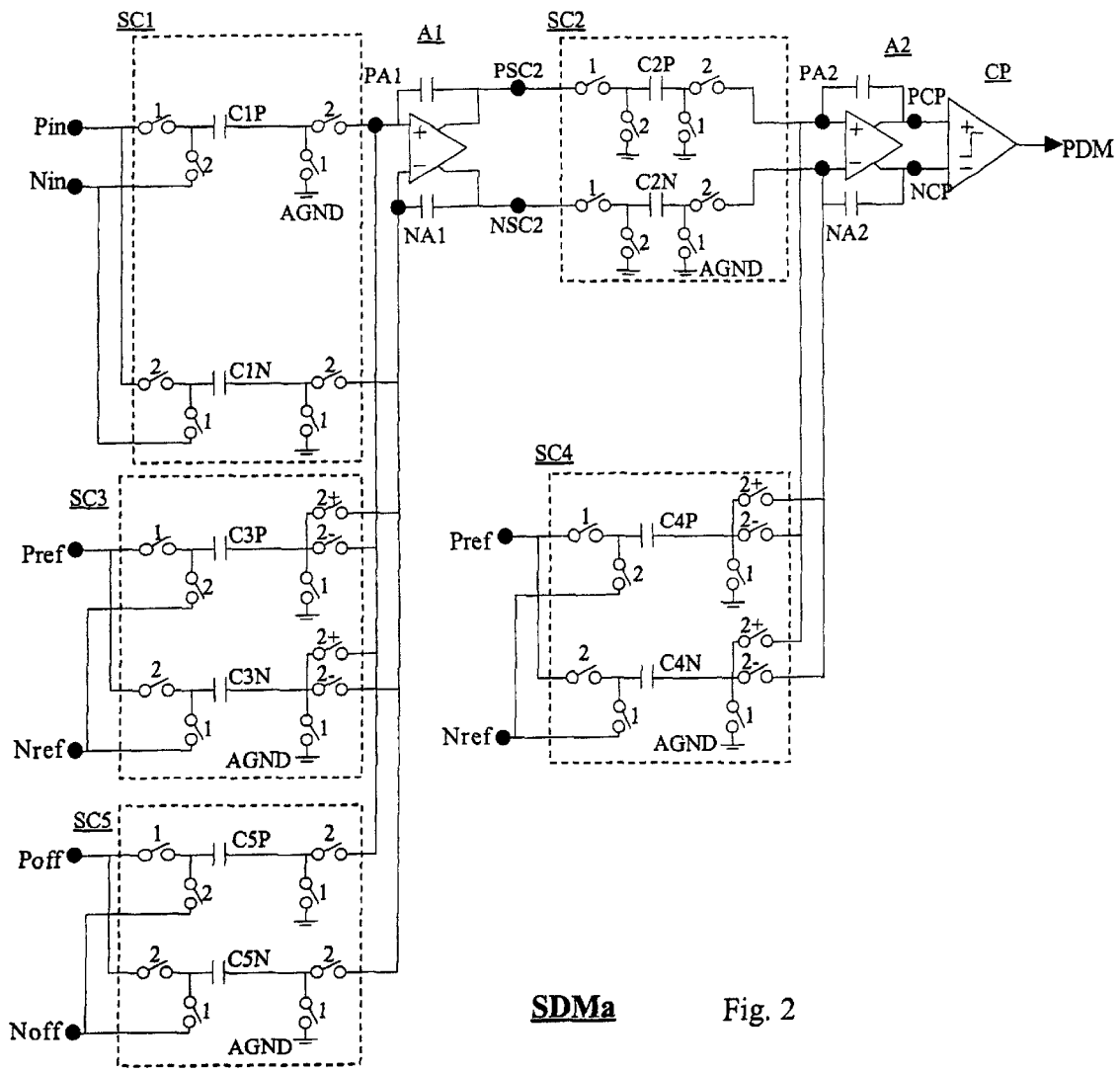
SDMa  Fig. 2

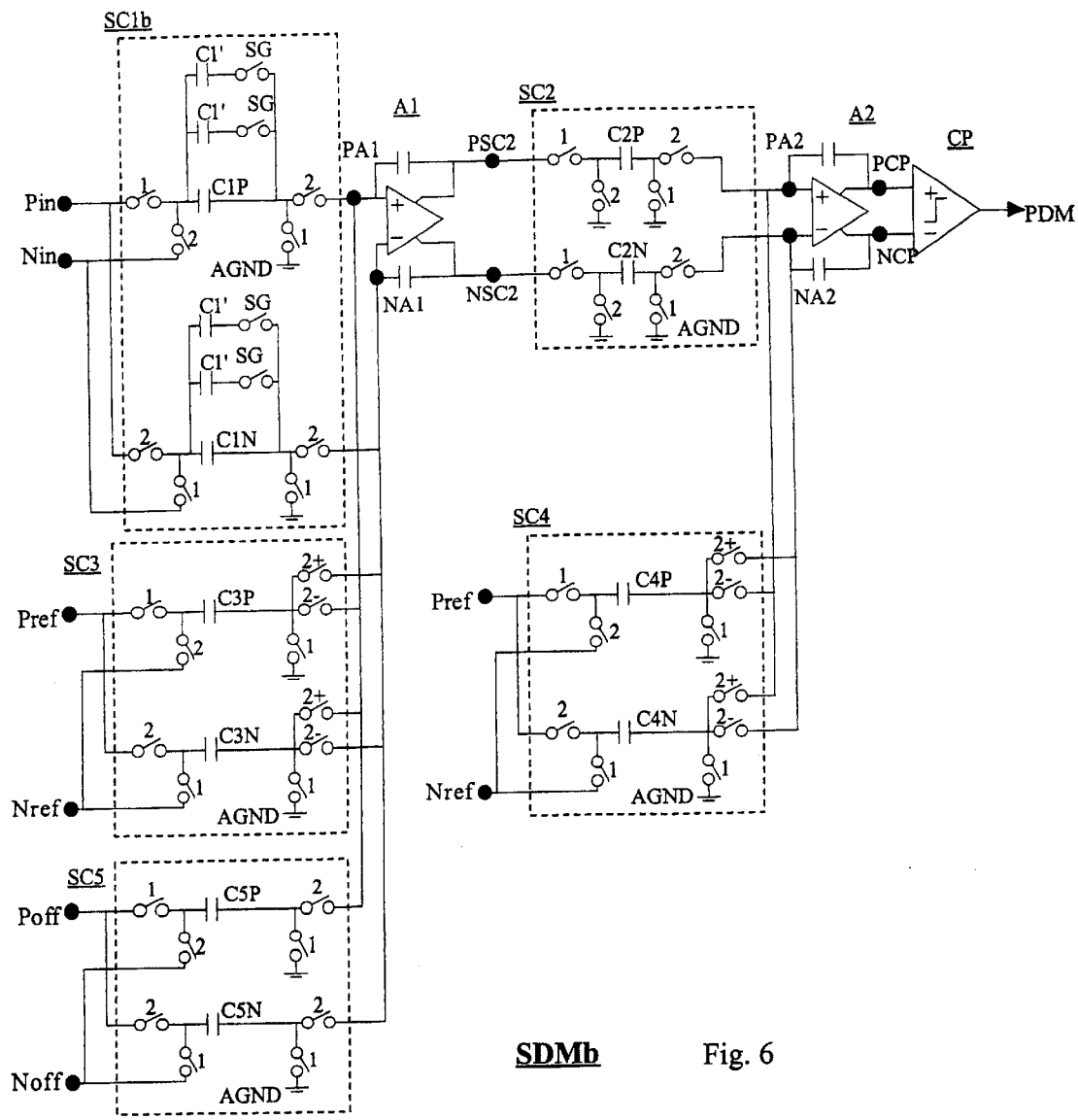
SDMb  Fig. 6

TRANSDUCER INTERFACE ARRANGEMENT INCLUDING A SIGMA-DELTA MODULATOR WITH OFFSET CORRECTION AND WITH GAIN SETTING

BACKGROUND OF THE INVENTION

The present invention relates to a transducer interface arrangement including sensor means for measuring a parameter, an analog-to-digital converter and a selectable resistor string, said sensor means having transducer input terminals to which an excitation voltage is applied and sensor output terminals coupled to data input terminals of said converter, said selectable resistor string having an input connected to said transducer input terminals and being adapted to produce an offset voltage derived from said excitation voltage by means of controlled switches included in said selectable resistor string, said offset voltage being applied to said converter, said analog-to-digital converter comprising a sigma-delta modulator including, connected to said data input terminals, the cascade connection of a first switched-capacitor module, a first differential amplifier, a second switched-capacitor module and a second differential amplifier, and further including a third switched-capacitor module with an input at which a reference voltage is applied and with an output connected to an input of said first differential amplifier as well as a fourth switched-capacitor module with an input at which said reference voltage is applied and with an output connected to an input of said second differential amplifier.

Such a transducer interface arrangement is generally known in the art and most of the sensor means, hereafter merely called sensors, are supplied by an excitation voltage and give a differential output voltage. The differential output voltage is proportional to the excitation voltage and is a function of the parameter to be measured, e.g. pressure, temperature, . . . , by the sensor. For most of the sensors the differential output voltage is composed out of an offset voltage and a real differential signal of interest, and this offset voltage can be much higher than the real differential signal. The offset voltage is depending on the manufacturing of the sensor, for a certain type of sensor this value can have a big tolerance, but for one sensor the value is fairly stable: it only has a small variation over temperature.

The measurement is performed by amplifying the signal at the sensor output terminals in a very low noise amplifier, e.g. a chopper stage, preceding the analog-to-digital converter, or A/D converter. The problem with this arrangement is that the input range of the transducer has to cover the complete range of possible offset and real signals. The offset voltage may, as an example, range from −17.5 mV to +17.5 mV, while the real signal is only a fraction of this and may for instance range from 0 mV to 10 mV. In this way, if a signal with an accuracy of 12 bits has to be measured, the 12 bits are needed on the real input signal, i.e. between 0 mV and 10 mV. But since the whole range of offset and real signals has to be covered, the A/D converter needs to have an input range from −17.5 mV (=−17.5 mV+0 mV) to +27.5 mV (=+17.5 mV+10 mV), and thus an accuracy of more than 14 bits.

A possible way of optimizing this arrangement would be to use a first low noise amplifier stage to amplify the small input signal, followed by a second amplifier stage for shifting the signal so that the real signal of interest fits the input range of the A/D converter at the data input terminals thereof. The second amplifier stage is controlled by the selectable resistor string so that it adds the inverse of the offset voltage to the signal at the sensor output terminals. The original offset voltage is thereby almost removed from the signal applied to the data input terminals of the converter and the accuracy of the A/D converter can be reduced to 12 bits again (or a little higher to have some margin). Such an arrangement needs only once a calibration cycle in order to determine the inverse of the offset voltage.

A disadvantage of this solution is that the second active stage adds a temperature dependent offset, adds extra tolerances on the gain, and leads to additional chip area and power consumption.

SUMMARY OF THE INVENTION

An object of the present invention is to provide a transducer interface arrangement of the above known type but without adding unnecessary tolerances to the performances of the arrangement, while saving area and power consumption.

According to the invention, this object is achieved due to the fact that said selectable resistor string is further adapted to produce said reference voltage applied to the inputs of said third and fourth switched-capacitor modules, and that said sigma-delta modulator further includes a fifth switched-capacitor module to an input of which said offset voltage is applied and with an output connected to the input terminals of said first differential amplifier.

In this way, the above mentioned second amplifier stage used for shifting the signal is advantageously replaced by the fifth switched capacitor module of which the power consumption is relatively lower, while requiring less area on the chip and avoiding to introduce extra noise and offset.

In more detail, said first, second, third, fourth and fifth switched-capacitor modules have differential input terminals and differential output terminals and comprise capacitors and switches controlled by a clock signal so as to couple said differential input terminals either to said differential output terminals via said capacitors or to a ground reference terminal at a ground reference voltage.

These switched capacitor modules are mainly used to filter possible differences between an analog ground voltage to which the sensor refers and the ground reference voltage to which the above sigma-delta modulator refers. The switches are controlled by the clock signal to avoid clock overlapping between different phases of the clock signal as will be explained later.

Another characteristic feature of the present invention is that said fifth switched-capacitor module is identical to said first switched-capacitor module.

By duplicating the first switched-capacitor module, that is an input circuitry of the converter, into the fifth switched-capacitor module, an extra input to the converter is provided. A compensation signal for the offset voltage to be eliminated may then be applied to this extra input and so further to the other circuitry of the A/D converter via the fifth switched-capacitor module.

Again in more detail, said fifth switched-capacitor module comprises a first set and a second set of switches, the switches of said first and said second set being respectively closed during a first phase and a second phase of said clock signal, the switches of said first set interconnect a first of the differential input terminals to said ground reference terminal via a first capacitor, and interconnect a second of said differential input terminals to said ground reference terminal via a second capacitor, and the switches of said second set interconnect said second input terminal to a first of the differential output terminals via said first capacitor, and interconnect said first input terminal to a second of said differential output terminals via said second capacitor.

When the switches of the fifth switched-capacitor module are clocked the same way as the switches of the first switched-capacitor module, then a conversion of the sum of the signals at the data input terminals and at the input of the fifth switched-capacitor module is performed by the transducer.

In a variant of this embodiment, said fifth switched-capacitor module comprises a first set and a second set of switches, the switches of said first and said second set being respectively closed during a first phase and a second phase of said clock signal, the switches of said first set interconnect a first of the differential input terminals to said ground reference terminal via a second capacitor, and interconnect a second of said differential input terminals to said ground reference terminal via a first capacitor, and the switches of said second set interconnect said first input terminal to a first of the differential output terminals via said first capacitor, and interconnect said second input terminal to a second of said differential output terminals via said second capacitor.

By changing the clocking of the switches of the fifth switched-capacitor module with respect to those of the first switched-capacitor module, the input signal of the fifth switched-capacitor module is subtracted from the signal at the data input terminals. Then a conversion of the difference of these signals is performed by the transducer rather than the sum thereof.

Referring again to the first embodiment, also another characteristic feature of the present invention is that said first set of switches comprises a first switch connected between said first input terminal and a first end of said first capacitor, a second switch connected between a second end of said first capacitor and said ground reference terminal, a third switch connected between said second input terminal and a first end of said second capacitor, and a fourth switch connected between a second end of said second capacitor and said ground reference terminal, and that said second set of switches comprises a first switch connected between said second input terminal and a first end of said first capacitor, a second switch connected between a second end of said first capacitor and said first output terminal, a third switch connected between said first input terminal and a first end of said second capacitor, and a fourth switch connected between a second end of said second capacitor and said second output terminal.

This relatively simple fifth switched capacitor module requires less chip area and power consumption than the above mentioned second amplifier stage used for shifting the signal that it advantageously replaces.

Still another characteristic feature of the present invention is that said selectable resistor string comprises a plurality of resistors connected in series across the transducer input terminals, that said controlled switches of said selectable resistor string are connected to junction points of the series connected resistors, that said reference voltage is provided at a first reference terminal of said selectable resistor string, connected to a junction point of two series connected resistors, and at a second reference terminal of said selectable resistor string, connected to an end of the series connected resistors, and that said offset voltage is provided at a first offset terminal of said selectable resistor string, connected to a junction point of two series connected resistors via one of said controlled switches, and at a second offset terminal connected to said end of the series connected resistors.

In this way, the same series connected resistors are used to provide both the reference voltage and the offset voltage. The chip area and the power consumption are thus not affected by this improvement.

Additionally to the offset correction, gain setting is also done in a conventional circuit by adding an additional amplifier stage in front of the A/D converter, with all the consecutive drawbacks as explained above.

Therefore, another object of the present invention is to provide a transducer that, additionally to the above-mentioned offset correction, also includes an easy gain setting without dramatically increasing the required chip area and power consumption.

According to the invention, this other object is achieved due to the fact that said first switched-capacitor module has differential input terminals connected to said data input terminals and comprises a first set and a second set of switches, the switches of said first and said second set being respectively closed during a first phase and a second phase of said clock signal, that the switches of said first set interconnect a first of the differential input terminals to said ground reference terminal via a first capacitor, and interconnect a second of said differential input terminals to said ground reference terminal via a second capacitor, that the switches of said second set interconnect said second input terminal to a first of the differential output terminals via said first capacitor, and interconnect said first input terminal to a second of said differential output terminals via said second capacitor, and that said first and said second capacitor are each coupled in parallel with a gain setting module comprising at least one series connection of an extra capacitor and a controlled extra switch.

By adding one or more extra capacitors in parallel with the existing first and second capacitors in the first switched-capacitor module the gain, or input range, of the sigma-delta modulator can be changed. These extra capacitors are selected by the extra switches controlled, e.g., by a digital circuit. These controlled extra switches are not clocked but are switched on or off depending on the desired gain. The more extra capacitors added, the higher the gain.

Further characteristic features of the present transducer interface arrangement are mentioned in the appended claims.

BRIEF DESCRIPTION OF THE DRAWINGS

The above and other objects and features of the invention will become more apparent and the invention itself will be best understood by referring to the following description of an embodiment taken in conjunction with the accompanying drawings wherein:

FIG. 2 shows in more detail the internal circuitry of a sigma-delta modulator SDMa forming part of an analog-to-digital converter included in a transducer interface arrangement according to the invention;

FIG. 6 shows the internal circuitry of a variant sigma-delta modulator SDMb including gain setting possibilities in a switched-capacitor module SC1b.

DETAILED DESCRIPTION OF THE INVENTION

Figure 1:
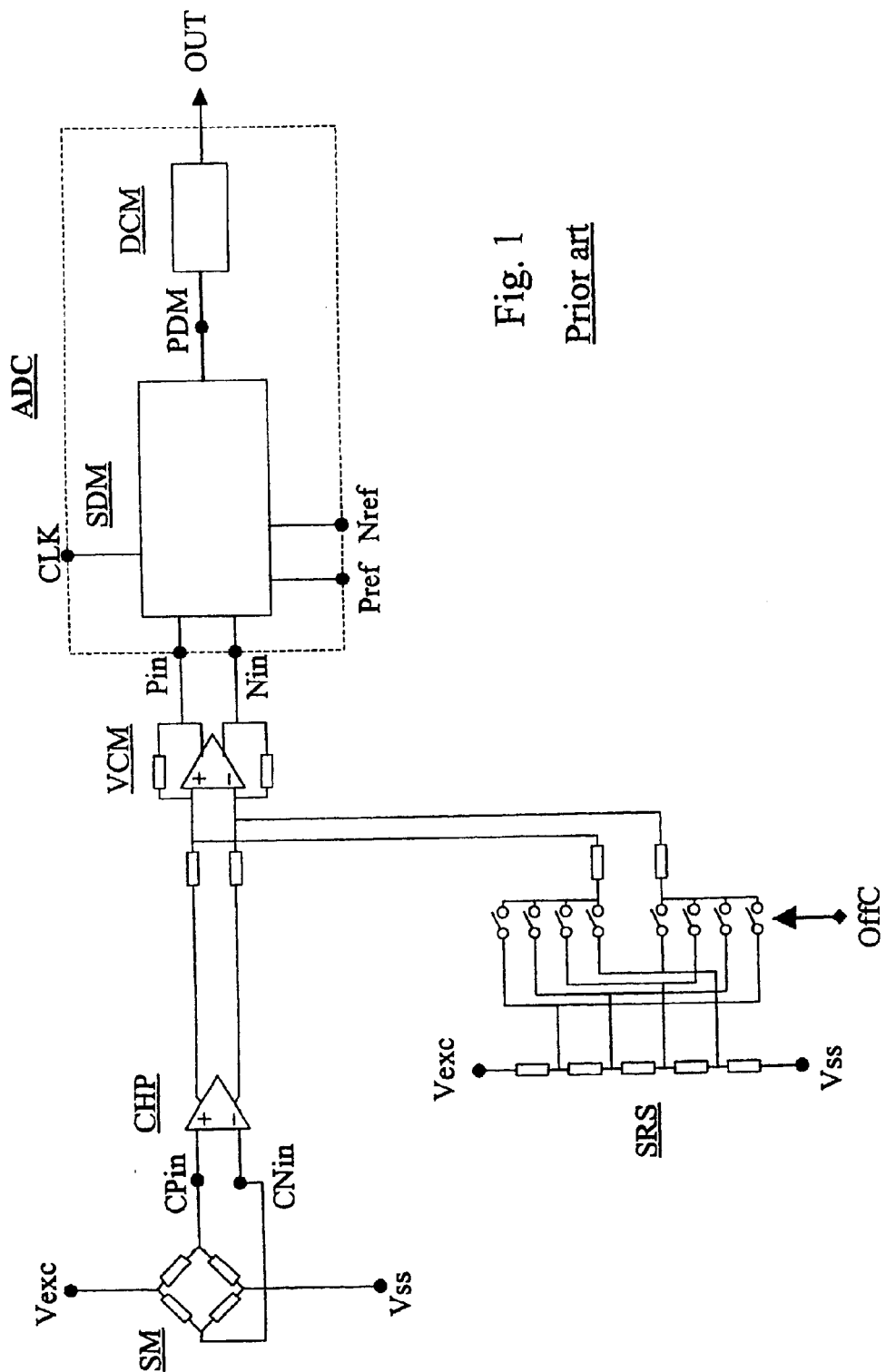
FIG. 1 shows a conventional transducer interface arrangement associated to a sensor SM as generally known in the art.

A transducer as shown at FIG. 1 is generally known in the art and mainly includes a sensor SM adapted to measure a parameter such as pressure, temperature, ... and an analog-to-digital converter ADC at an output OUT of which is provided a like-named digital signal that is a function of the measured parameter.

The sensor SM has input terminals Vexc, Vss at which an excitation voltage is applied and output terminals CPin, CNin at which a differential output voltage, function of the excitation voltage and proportional to the measured parameter, is provided. This output voltage is then applied to data input terminals Pin, Nin of the analog-to-digital converter, or A/D converter, ADC in order to produce the digital output signal OUT. The measurement also comprises the amplification of the signal at the output of the sensor SM prior to apply it to the input of the A/D converter ADC. To this end, the output terminals CPin, CNin of SM are connected to inputs of a chopper stage CHP operating as a very low noise differential amplifier. The outputs of the chopper stage CHP are further coupled to the data input terminals Pin, Nin of the A/D converter ADC via a second differential amplifier VCM.

The output voltage of the sensor SM is composed out of an offset voltage and a real differential signal of interest, and the latter is generally much lower than the offset voltage. In order to cover the complete range of possible offset and real signals, the offset voltage needs to be eliminated or at least dramatically reduced. Indeed, the offset voltage may, as an example, range from −17.5 mV to +17.5 mV, while the real signal is only a fraction of this and may for instance range from 0 mV to 10 mV. In this way, if a signal with an accuracy of 12 bits has to be measured, the 12 bits are needed on the real input signal, i.e. between 0 mV and 10 mV. But since the whole range of offset and real signals has to be covered, the A/D converter ADC should need to have an input range from −17.5 mV (=−17.5 mV+0 mV) to +27.5 mV (=+17.5 mV+10 mV), and thus an accuracy of more than 14 bits. To eliminate the offset voltage and apply only the useful differential signal as data input to the A/D converter ADC, a selectable resistor string SRS and the differential amplifier VCM are added.

The selectable resistor string SRS comprises several resistors series connected between the input terminals Vexc, Vss in order to receive the above mentioned excitation voltage. The junction points of these resistors are connected to switches of which the other end is coupled to inputs of the differential amplifier VCM. As already mentioned, the output terminals CPin and CNin of SM are also coupled to the inputs of the differential amplifier VCM. The switches of SRS are controlled by an offset correction signal OffC obtained during the calibration cycle of the circuit. By a suitable choice of the offset correction signal OffC, the inverse of the offset voltage can be applied to the inputs of the amplifier VCM via SRS. This inverse offset signal is then added to the composite signal coming from the sensor SM via the chopper CHP. Consequently, at the outputs of the differential amplifier VCM, i.e. at the data input terminals Pin and Nin, only the real differential signal of interest is provided. The accuracy of the A/D converter ADC may so be reduced to 12 bits.

The A/D converter ADC used in a transducer application is a Sigma-Delta modulator SDM followed by a decimation filter or decimator DCM. The sigma-delta modulator SDM has the data input terminals Pin and Nin and an output terminal PDM. The modulator SDM is clocked by a clock signal CLK, and the output is a one-bit PDM signal available at the like-named output terminal. The digital decimation filter DCM will then convert the high frequency PDM signal into a low frequency 12-bit word.

The idea of the present invention is to combine the second amplifier stage VCM with an input stage of the A/D converter in order to save area on the chip and power consumption. Furthermore, no unnecessary tolerances to the performance of our circuit should be added. This improved solution is described hereafter.

The structure of a sigma-delta modulator SDMa allowing to add, in a simple way, the extra offset cancellation is shown at FIG. 2. It is to be noted that in this figure a $2^{nd}$ order Sigma-Delta modulator SDMa is given as an example but that the following description is applicable on all types of Sigma-Delta modulators.

The sigma-delta modulator SDMa has the data input terminals Pin and Nin, reference input terminals Pref and Nref, offset input terminals Poff and Noff and the output terminal PDM. SDMa comprises:

a first switched-capacitor module SC1 having differential input terminals Pin and Nin connected to the like-named data input terminals and differential output terminals PA1 and NA1;

a second switched-capacitor module SC2 having differential input terminals PSC2 and NSC2 and differential output terminals PA2 and NA2;

a third switched-capacitor module SC3 having differential input terminals Pref and Nref and differential output terminals PA1 and NA1;

a fourth switched-capacitor module SC4 having differential input terminals Pref and Nref and differential output terminals PA2 and NA2;

a fifth switched-capacitor module SC5 having differential input terminals Poff and Noff and differential output terminals PA1 and NA1;

a first differential amplifier A1 having differential input terminals PA1 and NA1 and differential output terminals PSC2 and NSC2;

a second differential amplifier A2 having differential input terminals PA2 and NA2 and differential output terminals PCP and NCP; and a comparator CP having differential input terminals PCP and NCP and the single ended output terminal PDM.

All the like-named terminals are connected together.

The sigma-delta modulator SDMa of the invention distinguishes from the known one SDM in that the present one includes a fifth switched-capacitor modules SC5 controlled by an offset signal provided by the selectable resistor string, and in that the reference signal applied to the terminals Pref and Nref of SC3 and SC4 is also provided by the selectable resistor string instead as being the excitation voltage supplied to the sensor SM.

The switched-capacitor module SC1 comprises a first set of 4 switches 1, a second set of 4 switches 2 and two capacitors C1P and C1N. One end of a first capacitor C1P is connected to a first input terminal Pin via a first switch 1 and to a second input terminal Nin via a first switch 2. The other end of C1P is connected to a first output terminal PA1 via second switch 2 and to an analog ground reference terminal AGND via a second switch 1. One end of a second capacitor C1N is connected to the first input terminal Pin via a third switch 2 and to the second input terminal Nin via a third switch 1. The other end of C1N is connected to a second output terminal NA1 via a fourth switch 2 and to the ground reference terminal AGND via a fourth switch 1.

The switches 1 of the first set are closed during a first phase of the clock signal CLK, whilst the switches 2 of the second set are closed during the second phase of this clock signal CLK, the first and second phases being non-overlapping. This is also true for the switches 1 and 2 of the other modules SC2 to SC5 that will be described below.

The switched-capacitor module SC2 also comprises a first set of 4 switches 1, a second set of 4 switches 2 and two capacitors C2P and C2N. One end of a first capacitor C2P is connected to a first input terminal PSC2 via a first switch 1 and to the ground reference terminal AGND via a first switch 2. The other end of C2P is connected to a first output terminal PA2 via a second switch 2 and to the ground reference terminal AGND via a second switch 1. One end of a second capacitor C2N is connected to the second input terminal NSC2 via a third switch 1 and to the ground reference terminal AGND via a third switch 2. The other end of C2N is connected to a second output terminal NA2 via a fourth switch 2 and to the ground reference terminal AGND via a fourth switch 1.

The switched-capacitor modules SC3 and SC4 are similar and each comprise a first set of 4 switches 1, a second set of 3 switches 2, a third set of 4 switches 2− and 2+, and two capacitors: C3P and C3N for SC3, and C4P and C4N for SC4. In SC3/SC4, one end of a first capacitor C3P/C4P is connected to a first input terminal Pref via a first switch 1 and to a second input terminal Nref via a first switch 2. The other end of C3P/C4P is connected to a first output terminal PA1/PA2 via a first switch 2−, to a second output terminal NA1/NA2 via a first switch 2+, and to the ground reference terminal AGND via a second switch 1. One end of a second capacitor C3N/C4N is connected to the first input terminal Pref via a second switch 2 and to the second input terminal Nref via a third switch 1. The other end of C3N/C4N is connected to the first output terminal PA1/PA2 via a second switch 2+, to the second output terminal NA1/NA2 via a second switch 2−, and to the ground reference terminal AGND via a fourth switch 1.

The switches 2− and 2+ of the third set are controlled by the PDM output of the A/D converter, they are used to add or subtract the voltage at the reference input terminal from the differential input voltage of the transducer. Depending on appropriate control signals (not shown) either the switches 2− or the switches 2+ are closed during the second phase of the clock signal CLK.

Finally, a first embodiment SC5a of the fifth switched-capacitor module SC5 is identical to that of the first switched-capacitor module SC1 except that the input terminals are Poff and Noff instead as Pin and Nin, and the two capacitors C5P and C5N instead as C1P and C1N respectively.

Figure 3:
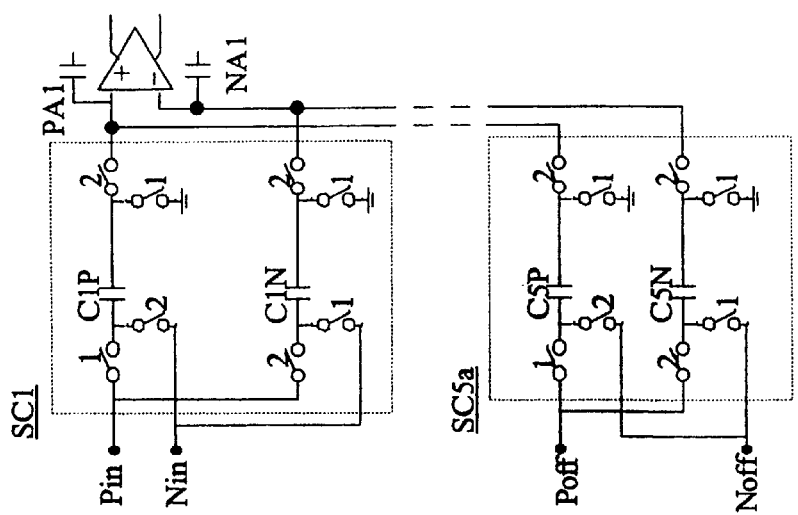

In this embodiment, shown at FIG. 3, the switches of the fifth switched-capacitor module SC5a are clocked the same way as the switches of the first switched-capacitor module SC1. The signals at the outputs of SC1 and SC5 are then added at the input PA1, NA1 of the first differential amplifier A1 of the sigma-delta modulator SDMa. In other words, a conversion of the sum of the signals at the data input terminals Pin, Nin and at the input Poff, Noff of the fifth switched-capacitor module is performed.

Figure 4:
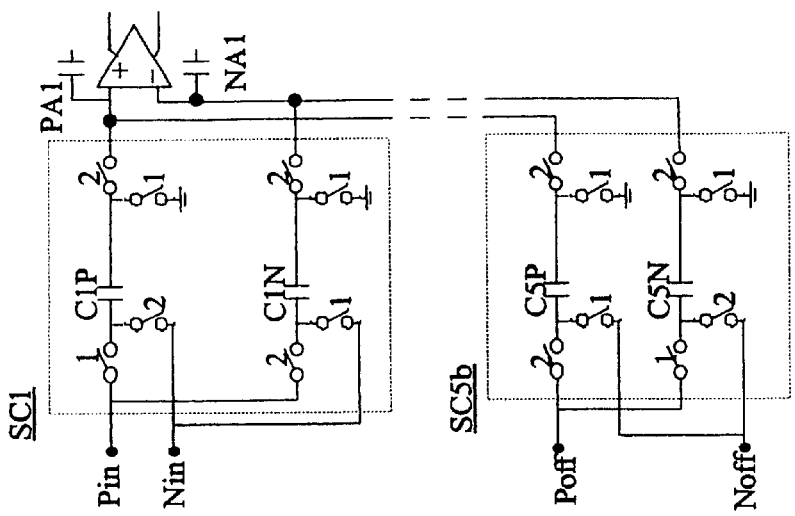
FIGS. 3 and 4 show two possible embodiments SC5a and SC5b of a switched-capacitor module SC5 of the sigma-delta modulator SDMa of FIG. 2.

In a second embodiment SC5b of the fifth switched-capacitor module SC5, the first mentioned end of the first capacitor C5P is connected to the first input terminal Poff via a first switch 2 and to the second input terminal Noff via a first switch 1. Furthermore, the first mentioned end of the second capacitor C5N is connected to the first input terminal Poff via a third switch 1 and to the second input terminal Noff via a third switch 2. This other embodiment is shown at FIG. 4.

By changing the clocking of the input switches of the fifth switched-capacitor module SC5 with respect to those of the first switched-capacitor module SC1, the input signal of the fifth switched-capacitor module is subtracted from the signal at the data input terminals. A conversion of the difference of these signals is then performed rather than the sum thereof.

As a result, by simply duplicating the input circuitry, i.e. the first switched-capacitor module SC1, an extra input pair of terminals Poff, Noff is added to the modulator at which an offset voltage may be provided for the requested offset compensation.

Figure 5:
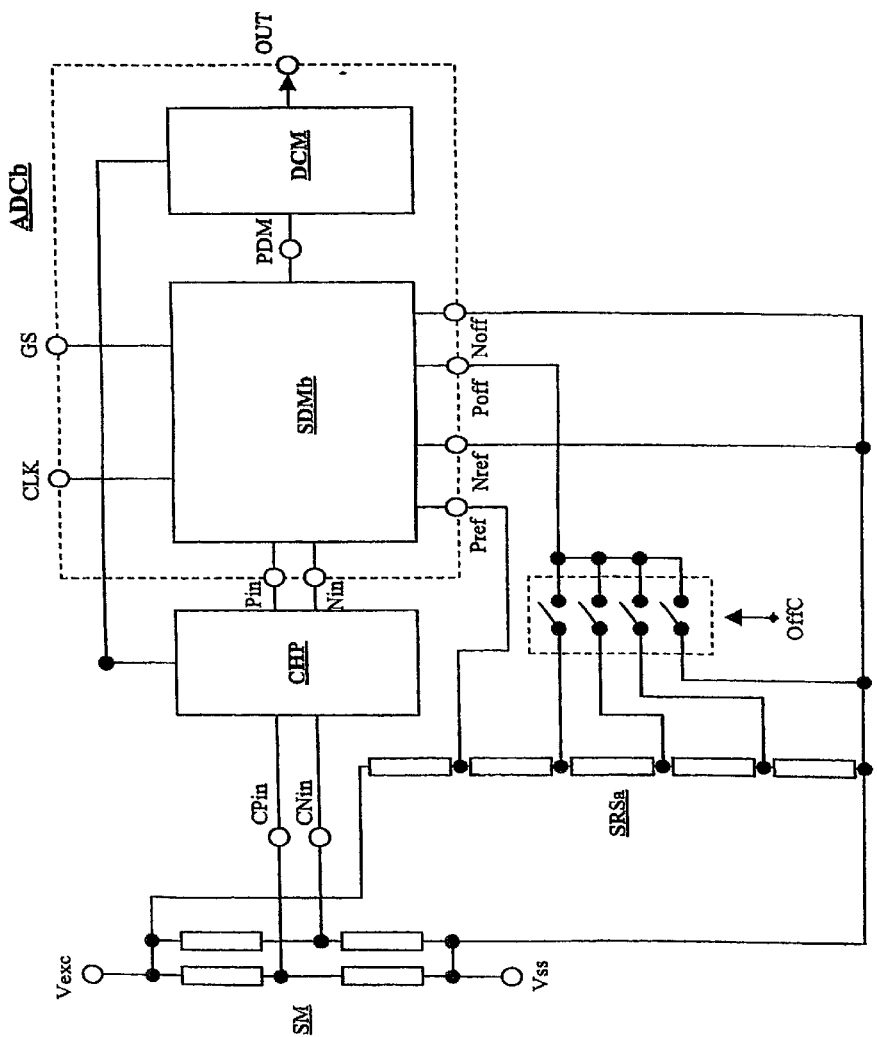
FIG. 5 represents the whole transducer interface arrangement according to the invention.

FIG. 5 represents the whole transducer. Therein, the outputs of the chopper CHP are directly connected to the data inputs Pin and Nin of the A/D converter ADCb. The selectable resistor string SRSa is slightly modified with respect to the one SRS shown at FIG. 1 in order to provide now both the reference voltage and the offset voltage.

In more detail, the selectable resistor string SRSa comprises several resistors connected in series between the input terminals Vexc and Vss. The junction point between a first and a second resistor in the series is connected to the terminal Pref, whilst the other junction points between resistors are connected to the terminal Poff via distinct switches controlled by an offset correction signal OffC. The terminal Vss is finally connected to both the terminals Nref and Noff off the sigma-delta modulator included in the A/D converter ADCb.

It is to be noted that although the above described sigma-delta modulator SDMa of FIG. 2 may be included in the A/D converter ADCb of FIG. 5, a preferred embodiment of this sigma-delta modulator, hereafter labeled SDMb and making reference to FIG. 6, is shown. The difference between SDMa and SDMb will be explained below.

Another improvement of the present transducer is that a gain setting is also added inside the sigma-delta modulator thereof. This extra feature is shown at FIG. 6.

The sigma-delta modulator SDMb of FIG. 6 is identical to SDMa shown at FIG. 2 except for the first switched-capacitor module SC1b that now includes gain setting modules. These gain setting modules are constituted by one or more branches coupled in parallel across the first C1P and the second C1N capacitors of SC1. The branches each comprises the series connection of an extra capacitor C1' and an extra switch SG. These extra switches SG, controlled by a digital gain control signal applied to a gain setting input GS of SDMb, as shown at FIG. 5, are not clocked but are switched on or off depending on the desired gain. By adding the extra capacitors in parallel with the existing capacitors C1P and C1N, the gain or input range of the modulator can be changed. The more capacitors we add, the higher the gain.

While the principles of the invention have been described above in connection with specific apparatus, it is to be clearly understood that this description is made only by way of example and not as a limitation on the scope of the invention, as defined in the appended claims.

What is claimed is:

1. Transducer interface arrangement including sensor means (SM) for measuring a parameter, an Analog-to-Digital Converter (ADCb) and a selectable resistor string (SRSa), said sensor means having transducer input terminals (Vexc, Vss) to which an excitation voltage is applied and sensor output terminals (CPin, CNin) coupled to data input terminals (Pin, Nin) of said converter, said selectable resistor string (SRSa) having an input connected to said transducer input terminals and being adapted to produce an offset voltage derived from said excitation voltage by means of controlled switches included in said selectable resistor string, said offset voltage being applied to said converter, said analog-to-digital converter comprising a Sigma-Delta Modulator (SDMa, SDMb) including, connected to said data input terminals, the cascade connection of a first switched-capacitor module (SC1, SC1b), a first differential amplifier (A1), a second switched-capacitor module (SC2) and a second differential amplifier (A2), and further including a third switched-capacitor module (SC3) with an input (Pref, Nref) at which a reference voltage is applied and with an output connected to an input (PA1, NA1) of said first differential amplifier (A1) as well as a fourth switched-capacitor module (SC4) with an input (Pref, Nref) at which said reference voltage is applied and with an output connected to an input (PA2, NA2) of said second differential amplifier (A2), characterized in that said selectable resistor string (SRSa) is further adapted to produce said reference voltage applied to the inputs of said third (SC3) and fourth (SC4) switched-capacitor modules, and in that said sigma-delta modulator (SDMa, SDMb) further includes a fifth switched-capacitor module (SC5) to an input (Poff, Noff) of which said offset voltage is applied and with an output connected to the input terminals (PA1, NA1) of said first differential amplifier (A1).

2. Transducer interface arrangement according to claim 1, characterized in that said first (SC1), second (SC2), third (SC3), fourth (SC4) and fifth (SC5) switched-capacitor modules have differential input terminals (Pin, Nin; PSC2, NSC2; Pref, Nref; Pref, Nref; Poff, Noff) and differential output terminals (PA1, NA1; PA2, NA2; PA1, NA1; PA2, NA2; PA1, NA1) and comprise capacitors (C1P, C1N; C2P, C2N; C3P, C3N; C4P, C4N; C5P, C5N) and switches (1,2) controlled by a clock signal (CLK) so as to couple said differential input terminals either to said differential output terminals via said capacitors or to a ground reference terminal (AGND) at a ground reference voltage.

3. Transducer interface arrangement according to claim 2, characterized in that said fifth switched-capacitor module (SC5) is identical to said first switched-capacitor module (SC1).

4. Transducer interface arrangement according to claim 2, characterized in that said fifth switched-capacitor module (SC5) comprises a first set (1) and a second set (2) of switches, the switches of said first and said second set being respectively closed during a first phase and a second phase of said clock signal (CLK), in that the switches of said first set (1) interconnect a first (Poff) of the differential input terminals (Poff, Noff) to said ground reference terminal (AGND) via a first capacitor (C5P), and interconnect a second (Noff) of said differential input terminals (Poff, Noff) to said ground reference terminal (AGND) via a second capacitor (C5N), and in that the switches of said second set (2) interconnect said second input terminal (Noff) to a first (PA1) of the differential output terminals (PA1, NA1) via said first capacitor (C5P), and interconnect said first input terminal (Poff) to a second (NA1) of said differential output terminals (PA1, NA1) via said second capacitor (C5N).

5. Transducer interface arrangement according to claim 4, characterized in that said first set of switches (1) comprises a first switch connected between said first input terminal (Poff) and a first end of said first capacitor (C5P), a second switch connected between a second end of said first capacitor (C5P) and said ground reference terminal (AGND), a third switch connected between said second input terminal (Noff) and a first end of said second capacitor (C5N), and a fourth switch connected between a second end of said second capacitor (C5N) and said ground reference terminal (AGND), and in that said second set of switches (2) comprises a first switch connected between said second input terminal (Noff) and a first end of said first capacitor (C5P), a second switch connected between a second end of said first capacitor (C5P) and said first output terminal (PA1), a third switch connected between said first input terminal (Poff) and a first end of said second capacitor (C5N), and a fourth switch connected between a second end of said second capacitor (C5N) and said second output terminal (NA1).

6. Transducer interface arrangement according to claim 2, characterized in that said fifth switched-capacitor module (SC5) comprises a first set (1) and a second set (2) of switches, the switches of said first and said second set being respectively closed during a first phase and a second phase of said clock signal (CLK), in that the switches of said first set (1) interconnect a first (Poff) of the differential input terminals (Poff, Noff) to said ground reference terminal (AGND) via a second capacitor (C5N), and interconnect a second (Noff) of said differential input terminals (Poff, Noff) to said ground reference terminal (AGND) via a first capacitor (C5P), and in that the switches of said second set (2) interconnect said first input terminal (Poff) to a first (PA1) of the differential output terminals (PA1, NA1) via said first capacitor (C5P), and interconnect said second input terminal (Noff) to a second (NA1) of said differential output terminals (PA1, NA1) via said second capacitor (C5N).

7. Transducer interface arrangement according to claim 2, characterized in that said first switched-capacitor module (SC1b) has differential input terminals connected to said data input terminals (Pin, Nin) and comprises a first set (1) and a second set (2) of switches, the switches of said first and said second set being respectively closed during a first phase and a second phase of said clock signal (CLK), in that the switches of said first set (1) interconnect a first (Pin) of the differential input terminals (Pin, Nin) to said ground reference terminal (AGND) via a first capacitor (C1P), and interconnect a second (Nin) of said differential input terminals (Pin, Nin) to said ground reference terminal (AGND) via a second capacitor (C1N), in that the switches of said second set (2) interconnect said second input terminal (Nin) to a first (PA1) of the differential output terminals (PA1, NA1) via said first capacitor (C1P), and interconnect said first input terminal (Pin) to a second (NA1) of said differential output terminals (PA1, NA1) via said second capacitor (C1N), and in that said first (C1P) and said second (C1N) capacitor are each coupled in parallel with a gain setting module comprising at least one series connection of an extra capacitor (C1') and an controlled extra switch (SG).

8. Transducer interface arrangement according to claim 1, characterized in that said selectable resistor string (SRSa) comprises a plurality of resistors connected in series across the transducer input terminals (Vexc, Vss), in that said controlled switches of said selectable resistor string (SRSa) are connected to junction points of the series connected resistors, in that said reference voltage is provided at a first reference terminal (Pref) of said selectable resistor string, connected to a junction point of two series connected resistors, and at a second reference terminal (Nref) of said selectable resistor string, connected to an end of the series connected resistors, and in that said offset voltage is provided at a first offset terminal (Poff) of said selectable resistor string, connected to a junction point of two series connected resistors via one of said controlled switches, and at a second offset terminal (Noff) connected to said end of the series connected resistors.

9. Transducer interface arrangement according to claim 1, characterized in that said transducer interface arrangement further includes a chopper circuit (CHP) having an input connected to said sensor output terminals (CPin, CNin) and an output connected to said data input terminals (Pin, Nin).

10. Transducer interface arrangement according to claim 1, characterized in that said sigma-delta modulator (SDMa, SDMb) further includes a comparator circuit (CP) having an input connected to an output of said second differential amplifier (A2) and an output (PDM) coupled to a transducer interface arrangement output (OUT) via a decimator (DCM).

11. Transducer interface arrangement including sensor means (SM) for measuring a parameter, an Analog-to-Digital Converter (ADCb) and a selectable resistor string (SRSa), said sensor means having transducer input terminals (Vexc, Vss) to which an excitation voltage is applied and sensor output terminals (CPin, CNin) coupled to data input terminals (Pin, Nin) of said converter, said selectable resistor string (SRSa) having an input connected to said transducer input terminals and being adapted to produce an offset voltage derived from said excitation voltage by means of controlled switches included in said selectable resister string, said offset voltage being applied to said converter, said analog-to-digital converter comprising a Sigma-Delta Modulator (SDMa, SDMb) including, connected to said data input terminals, the cascade connection of a first switched-capacitor module (SC1, SC1b), a first differential amplifier (A1), a second switched-capacitor module (SC2) and a second differential amplifier (A2), and further including a third switched-capacitor module (SC3) with an input (Pref, Nref) at which a reference voltage is applied and with an output connected to an input (PA1, NA1) of said first differential amplifier (A1) as well as a fourth switched-capacitor module (SC4) with an input (Pref, Nref) at which said reference voltage is applied and with an output connected to an input (PA2, NA2) of said second differential amplifier (A2), and a fifth switched-capacitor module (SC5) with an input (Poff, Noff) at which said offset voltage is applied and with an output connected to the input (PA1, NA1) of said first differential amplifier (A1), wherein said first (SC1), second (SC2), third (SC3), fourth (SC4) and fifth (SC5) switched-capacitor modules have differential input terminals (Pin, Nin; PSC2, NSC2; Pref, Nref; Pref, Nref; Poff, Noff) and differential output terminals (PA1, NA1; PA2, NA2; PA1, NA1; PA2, NA2; PA1, NA1) and comprise capacitors (C1P, C1N; C2P, C2N; C3P, C3N; C4P, C4N; C5P, C5N) and switches (1,2) controlled by a clock signal (CLK) so as to couple said differential input terminals either to said differential output terminals via said capacitors or to a ground reference terminal (AGND) at a ground reference voltage, wherein said fifth switched-capacitor module (SC5) comprises a first set (1) and a second set (2) of switches, the switches of said first and said second set being respectively closed during a first phase and a second phase of said clock signal (CLK), wherein the switches of the first set (1) interconnect a first (Poff) of the differential input terminals (Poff, Noff) to said ground reference terminal (AGND) via a first capacitor (C5P), and interconnect a second (Noff) of said differential input terminals (Poff, Noff) to said ground reference terminal (AGND) via a second capacitor (C5N), and wherein that the switches of said second set interconnect said second input terminal (Noff) to a first (PA1) of the differential output terminals (PA1, NA1) via the first capacitor (C5P), and interconnect said first input terminal (Poff) to a second (NA1) of said differential output terminals (PA1, NA1) via a second capacitor (C5N).

12. Transducer interface arrangement according to claim 11, characterized in that said first set of switches (1) comprises a first switch connected between said first input terminal (Poff) and a first end of said first capacitor (C5P), a second switch connected between a second end of said first capacitor (C5P) and said ground reference terminal (AGND), a third switch connected between said second input terminal (Noff) and a first end of said second capacitor (C5N), and a fourth switch connected between a second end of said second capacitor (C5N) and said ground reference terminal (AGND), and in that said second set of switches (2) comprises a first switch connected between a second input terminal (Noff) and a first end of said first capacitor (C5P), a second switch connected between a second end of said first capacitor (C5P) and said first output terminal (PA1), a third switch connected between said first input terminal (Poff) and a first end of said second capacitor (C5N), and a fourth switch connected between a second end of said second capacitor (C5N) and second output terminal (NA1).

* * * * *